United States Patent
Oda

(10) Patent No.: US 11,545,820 B2
(45) Date of Patent: Jan. 3, 2023

(54) ELECTRICAL CONNECTION BOX

(71) Applicant: Sumitomo Wiring Systems, Ltd., Mie (JP)

(72) Inventor: Maiko Oda, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 718 days.

(21) Appl. No.: 16/546,733

(22) Filed: Aug. 21, 2019

(65) Prior Publication Data

US 2020/0067293 A1 Feb. 27, 2020

(30) Foreign Application Priority Data

Aug. 24, 2018 (JP) .............................. JP2018-157435

(51) Int. Cl.
| | |
|---|---|
| *H02G 3/08* | (2006.01) |
| *H02G 3/14* | (2006.01) |
| *H05K 5/02* | (2006.01) |
| *B60R 16/02* | (2006.01) |
| *H02G 15/06* | (2006.01) |
| *H05K 5/00* | (2006.01) |
| *H05K 5/03* | (2006.01) |

(52) U.S. Cl.
CPC ............. *H02G 3/081* (2013.01); *H02G 3/088* (2013.01); *H02G 3/14* (2013.01); *H02G 15/06* (2013.01); *H05K 5/0008* (2013.01); *H05K 5/0026* (2013.01); *H05K 5/0217* (2013.01); *H05K 5/0247* (2013.01); *H05K 5/03* (2013.01)

(58) Field of Classification Search
CPC .......... H02G 3/081; H02G 3/083; H02G 3/14; H02G 3/18; H02G 3/088; H02G 15/06; B60R 16/0239; B60R 16/0238; B60R 16/0207

See application file for complete search history.

(56) References Cited

U.S. PATENT DOCUMENTS

| 4,449,015 A * | 5/1984 | Hotchkiss | .............. | H02G 3/083 |
| | | | | 439/522 |
| 2006/0089021 A1* | 4/2006 | Kanamaru | .......... | B60R 16/0215 |
| | | | | 439/76.2 |
| 2012/0222880 A1* | 9/2012 | Dinh | ........................ | H02G 3/14 |
| | | | | 174/50 |
| 2017/0311460 A1 | 10/2017 | Ozaki | | |
| 2018/0309278 A1* | 10/2018 | Ikeda | ....................... | H02G 3/18 |
| 2018/0342859 A1* | 11/2018 | Kiyota | ................ | B60R 16/0239 |

FOREIGN PATENT DOCUMENTS

| JP | 2013226019 A | * | 10/2013 | | |
| JP | 2014023322 A | * | 2/2014 | | |
| WO | WO-2009066661 A1 | * | 5/2009 | ............... | B60K 1/04 |

* cited by examiner

*Primary Examiner* — Hoa C Nguyen
*Assistant Examiner* — Amol H Patel
(74) *Attorney, Agent, or Firm* — Honigman LLP

(57) ABSTRACT

An electrical connection box capable of suppressing ingression of liquid is provided. The electrical connection box is configured to house an electrical device, to interconnect a plurality of in-vehicle device via the housed electrical device, and to be provided in a vehicle, and includes an insertion port that passes through a side wall and into which an electric wire to be connected to the electrical device is inserted, and an eave portion that is provided along an upper edge portion of the insertion port and protrudes outwardly by a predetermined length.

8 Claims, 4 Drawing Sheets

ELECTRICAL CONNECTION BOX

CROSS-REFERENCE TO RELATED APPLICATIONS

This application claims priority of Japanese Patent Application No. JP 2018-157435 filed on Aug. 24, 2018, the contents of which are incorporated herein.

TECHNICAL FIELD

The present disclosure relates to an electrical connection box.

BACKGROUND

A vehicle is provided with an electrical connection box (see JP 2017-200269A, for example) that interconnects a plurality of in-vehicle devices. Examples of the in-vehicle devices include a battery, a lamp, and a motor. An electrical device connected to the plurality of in-vehicle devices is housed in the electrical connection box disclosed in JP 2017-200269A.

SUMMARY

However, in the case where an insertion port for electric wires for connecting the electrical device and the in-vehicle devices is provided on a side wall, there is a risk that liquid flowing down from the upper side will ingress into the electrical connection box through the insertion port. Also, in a vehicle, in the case where the electrical connection box is inclined due to the vehicle body being inclined, there is a risk that liquid will ingress more easily.

An object of the present disclosure is to provide an electrical connection box capable of suppressing ingression of liquid.

An electrical connection box according to one aspect of the present disclosure is an electrical connection box that is configured to house an electrical device, to interconnect a plurality of in-vehicle devices via the housed electrical device, and to be provided in a vehicle, and includes an insertion port that passes through a side wall and into which an electric wire to be connected to the electrical device is inserted, and an eave portion that is provided along an upper edge portion of the insertion port and protrudes outwardly by a predetermined length.

According to the above configuration, it is possible to suppress ingression of liquid.

DETAILED DESCRIPTION OF PREFERRED EMBODIMENTS

Figure 1:
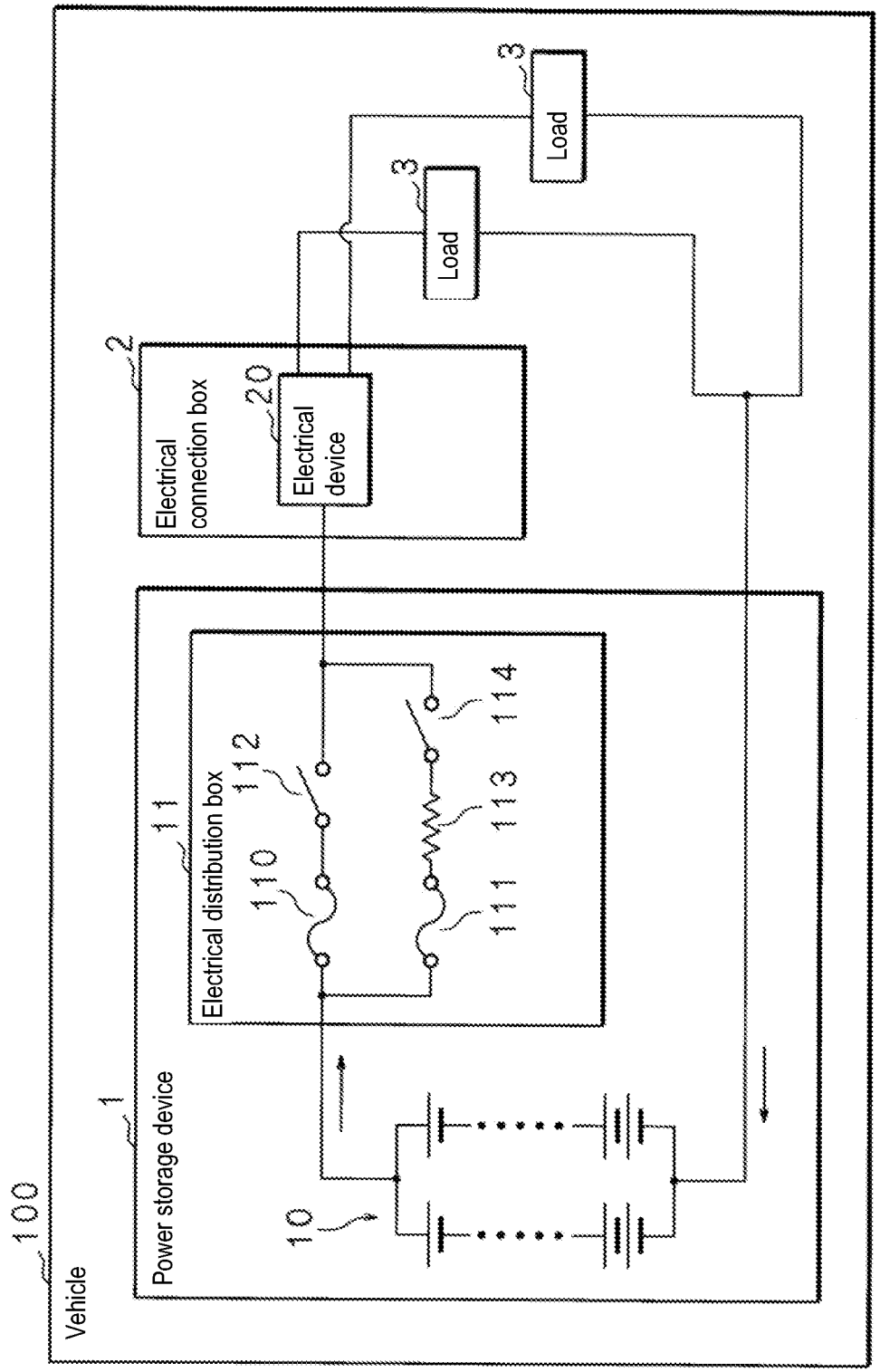
FIG. 1 is a block diagram showing a mode of installing an electrical connection box according to an embodiment in a vehicle.

Embodiments of the present disclosure will be listed and described. Also, at least some of the embodiments described below may be combined as appropriate.

An electrical connection box according to one aspect of the present disclosure is an electrical connection box that is configured to house an electrical device, to interconnect a plurality of in-vehicle devices via the housed electrical device, and to be provided in a vehicle, and includes an insertion port that passes through a side wall and into which an electric wire to be connected to the electrical device is inserted, and an eave portion that is provided along an upper edge portion of the insertion port and protrudes outwardly by a predetermined length.

In this aspect, the eave portion is capable of suppressing ingression of liquid flowing from the upper side through the insertion port. Also, even in the case where the electrical connection box is inclined due to the vehicle being inclined, it is possible to suppress ingression of liquid through the insertion port.

In the electrical connection box according to one aspect of the present disclosure, the predetermined length may be based on a maximum stable inclination angle of the vehicle.

In this aspect, the length by which the eave portion protrudes is based on the maximum stable inclination angle of the vehicle, and thus, even in the case where the electrical connection box is inclined due to the vehicle being inclined in a range based on the maximum stable inclination angle, it is possible to suppress ingression of liquid through the insertion port.

The electrical connection box according to one aspect of the present disclosure may include an opening provided in an upper portion, and a lid for closing the opening, and the eave portion may be provided in the lid.

In this aspect, it is possible to deal with the lid and the eave portion in an integrated manner.

In the electrical connection box according to one aspect of the present disclosure, an angle formed between a straight line connecting a protruding end of the eave portion and a lower edge of the insertion port and a perpendicular line extending from an upper edge of the insertion port to the lower edge of the insertion port may be less than or equal to 40 degrees.

In this aspect, it is possible to reduce the outer size and suppress ingression of liquid through the insertion port.

In the electrical connection box according to one aspect of the present disclosure, an angle formed between a straight line connecting a protruding end of the eave portion and a lower edge of the insertion port and a perpendicular line extending from an upper edge of the insertion port to the lower edge of the insertion port is less than or equal to 35 degrees.

In this aspect, it is possible to further reduce the outer size and suppress ingression of liquid through the insertion port.

In the electrical connection box according to one aspect of the present disclosure, an angle formed between a straight line connecting a protruding end of the eave portion and a lower edge of the insertion port and a perpendicular line extending from an upper edge of the insertion port to the lower edge of the insertion port may be greater than or equal to 30 degrees.

In this aspect, it is possible to suppress ingression of liquid through the insertion port.

Hereinafter, embodiments of the present disclosure will be specifically described with reference to the drawings.

FIG. 1 is a block diagram showing a mode of installing an electrical connection box according to an embodiment in a vehicle. Reference numeral 100 in FIG. 1 denotes a vehicle, and the vehicle 100 includes a power storage device 1, an electrical connection box 2 connected to the power storage device 1 via electric wires such as a wire harness, and a plurality of loads 3 (two in FIG. 1) connected to the electrical connection box 2 via electric wires such as a wire harness. The power storage device 1 is disposed under the hood, for example, and the electrical connection box 2 is disposed in the luggage compartment, for example.

The power storage device 1 includes a storage battery 10 and an electrical distribution box 11. The storage battery 10 is a lithium battery, for example, and is a secondary battery in which battery cells are connected in series-parallel.

The electrical distribution box 11 is a so-called junction box for distributing power from the storage battery 10 to in-vehicle devices. The electrical distribution box 11 has a plurality of systems for distributing power to in-vehicle devices. Note that, in FIG. 1, only the system for supplying power to the electrical connection box 2 is shown and the other systems are not shown.

Two fuses 110 and 111, a switch 112, a resistor 113, a switch 114, and the like, which constitute one system, are arranged inside the housing (not shown) of the electrical distribution box 11, the housing being waterproofed by a sealing member, for example. One end of each of the two fuses 110 and 111 is connected to a cathode of the storage battery 10 in parallel. The other end of the fuse 110 is connected to one end of the switch 112. The other end of the fuse 111 is connected to one end of the switch 114 via the resistor 113. The other ends of the switches 112 and 114 are connected to the electrical connection box 2. The switches 112 and 114 are turned ON and OFF using an ECU (Electronic Control Unit), which is not shown.

The electrical connection box 2 distributes power supplied from the electrical distribution box 11 to supply power to the loads 3 serving as a plurality of in-vehicle devices. The electrical connection box 2 includes an electrical device 20 connected to the switches 112 and 114 and the loads 3 by electric wires such as a wire harness. The electrical device 20 includes a fuse, a bus bar, and the like. Examples of the loads 3 include a lamp, a wiper, and a motor. One end of each load 3 is connected to the electrical device 20, and the other end is connected to an anode of the storage battery 10.

In the above-described configuration, as shown by arrows in FIG. 1, electric current flows from the cathode of the storage battery 10 to the loads 3 via the electrical distribution box 11 and the electrical connection box 2, and electric current flowing through the loads 3 flows to the anode of the storage battery 10.

Here, when the loads 3 are driven, the switch 114 is turned ON so that electric current flows to the resistor 113 side, and inrush current is reduced. Then, the switch 114 is turned OFF, and the switch 112 is turned ON to supply electric current to the loads 3. Due to the fuses 110 and 111 being provided, supply of power to the electrical connection box 2 and the loads 3 can be shut off if electric current with a predetermined electric current value or more flows.

Figure 2:
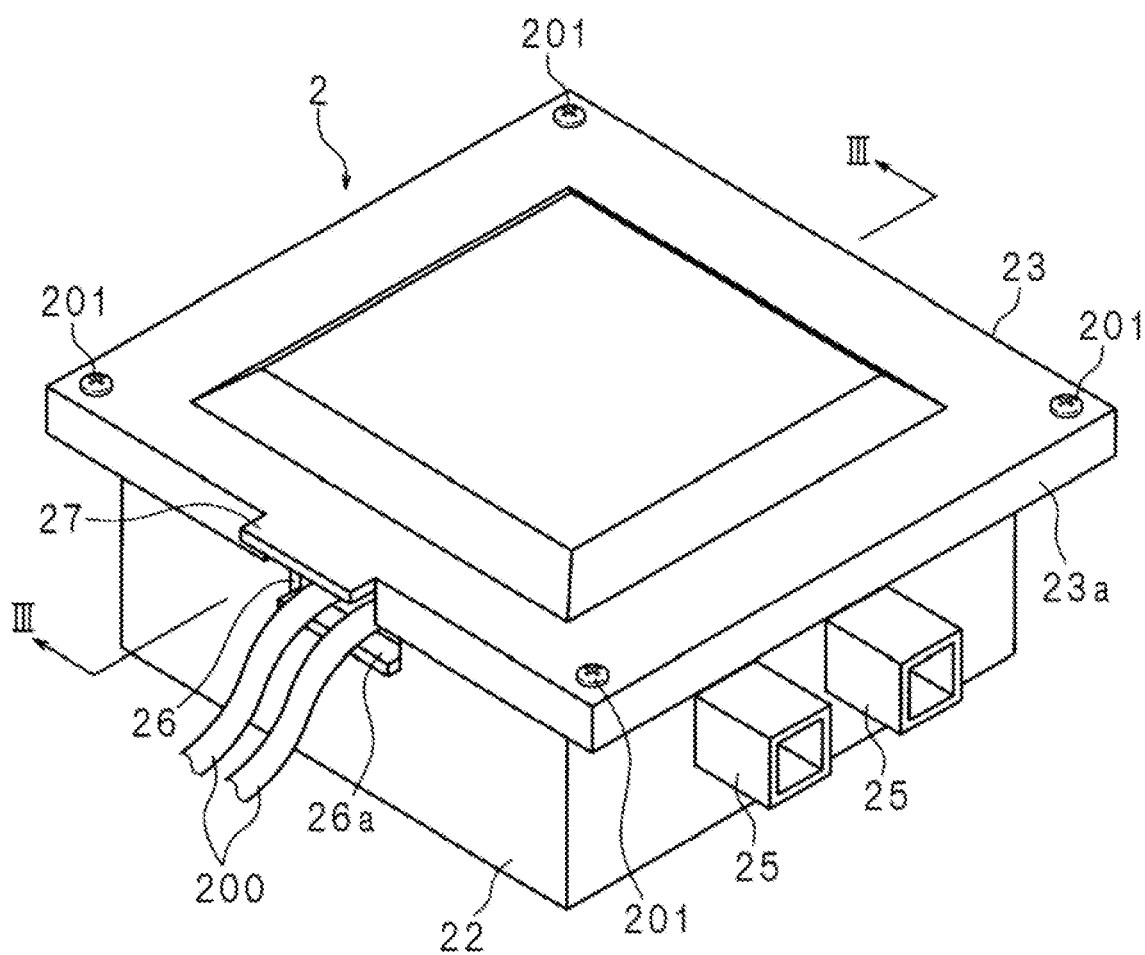
FIG. 2 is an external perspective view of the electrical connection box.
Figure 3:
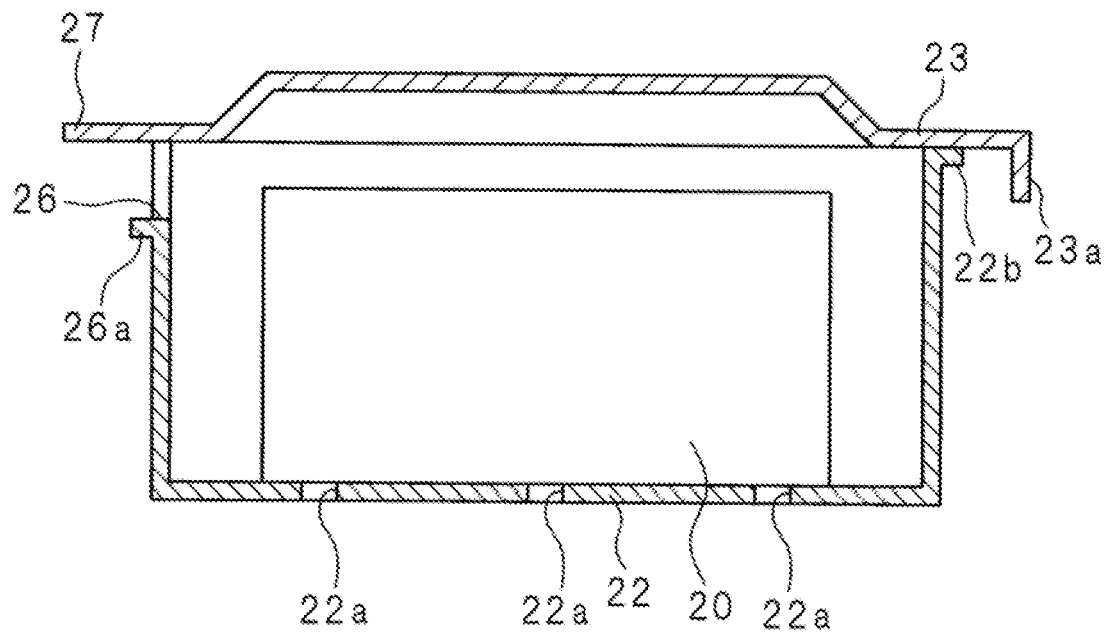
FIG. 3 is a cross-sectional view of the electrical connection box taken along line III-III.

FIG. 2 is an external perspective view of the electrical connection box 2. FIG. 3 is a cross-sectional view of the electrical connection box 2 taken along line III-III. The electrical connection box 2 includes a rectangular parallelepiped housing box 22 with one side being open, and a lid 23 for closing the opening of the housing box 22. The housing box 22 is installed in the vehicle 100 with the lid 23 facing upward.

The electrical device 20 is housed in the housing box 22. Two connectors 25 protrude from one side wall of the housing box 22, and the electrical device 20 is connected to electric wires through the connectors 25. The number of connectors 25 is not limited to that shown in FIG. 2, and it is sufficient to provide the connectors 25 in correspondence with the number of connecting electric wires.

Another side wall of the housing box 22 is provided with an insertion port 26 into which the wire harness 200 is inserted. The insertion port 26 is provided on the upper side of the other side wall, and has a rectangular shape that is longer in the horizontal direction. Note that the wire harness 200 is not shown in FIG. 3.

A lower edge portion of the insertion port 26 is provided with a flange portion 26a protruding outwardly. Also, a flange portion 22b protruding outwardly along the opening is provided in portions of an edge portion of the opening of the housing box 22 other than the insertion port 26.

The lid 23 has a rectangular plate shape, and has an outer size that is larger than the outer size of the opening of the housing box 22. An eave portion 27 is provided in the central portion of one side of the lid 23. The lid 23 is disposed so as to cover the entire opening of the housing box 22, with the eave portion 27 corresponding to the insertion port 26 and the lower surface of the lid 23 abutting against the flange portion 22b of the housing box 22. The lid 23 and the housing box 22 are fixed by screwing down the four corners using screws 201. The upper surface of the lid 23 is raised except for the peripheral edge portion. Accordingly, if liquid flows from the upper side, the lid 23 enables the liquid to flow to the outer side.

The eave portion 27 protrudes from a side end surface of the lid 23 and is flush with the upper and lower surfaces of the lid 23. The protruding end of the eave portion 27 protrudes outward of the flange portion 26a. An extending portion 23a extending in a downward direction is provided in portions of a peripheral edge portion of the lid 23 other than the eave portion 27. The extending portion 23a covers the gap between the lower surface of the lid 23 and the flange portion 22b.

Figure 4:
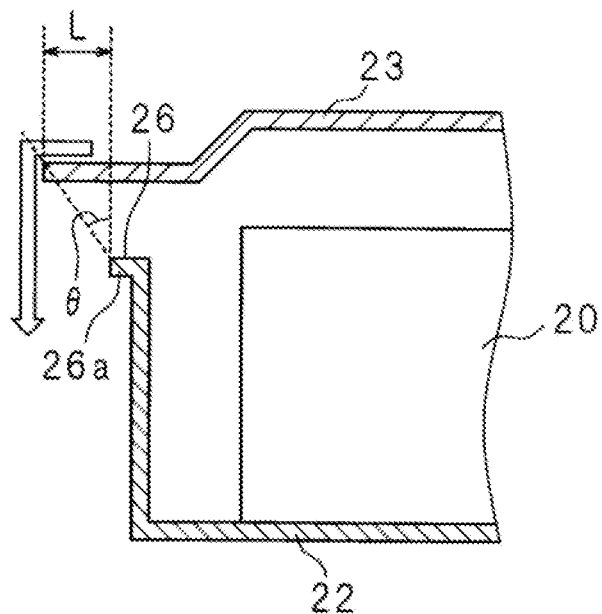
FIG. 4 is a partial cross-sectional view showing an insertion port.
Figure 5:
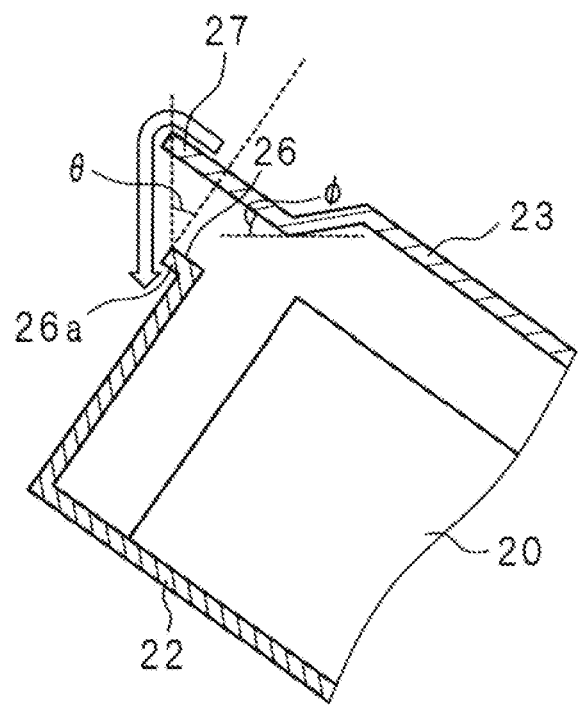
FIG. 5 is a partial cross-sectional view showing the insertion port.

FIGS. 4 and 5 are partial cross-sectional views showing the insertion port 26. FIG. 4 shows the case where the electrical connection box 2 installed in the vehicle 100 is not inclined, and FIG. 5 shows the case where the electrical connection box 2 is inclined upward at ø degrees with respect to the installation surface from the state shown in FIG. 4.

A length L, which is shown in FIG. 4, by which the eave portion 27 protrudes is provided as a predetermined length based on the maximum stable inclination angle of an automobile. Specifically, an angle θ formed between a straight line connecting the protruding end of the eave portion 27 and the lower end portion of the insertion port 26 (the protruding end of the flange portion 26a) and a perpendicular line extending from the upper end portion of the insertion port 26 to the lower end portion thereof is set in a range of angles including the maximum stable inclination angle of a vehicle. Here, the maximum stable inclination angle is 35 degrees in an automobile.

Liquid flowing down from the upper surface of the eave portion 27 flows to the lower side along the path indicated by the white arrow shown in FIG. 4. Due to the eave portion 27 protruding from the flange portion 26a, it is possible to suppress ingression of liquid into the electrical connection box 2 through the insertion port 26.

Here, if the angle θ is 35 degrees, for example, when the electrical connection box 2 is inclined at 35 degrees, which is the maximum stable inclination angle of the vehicle 100 (θ=35 degrees), as shown in FIG. 5, the leading end of the flange portion 26a is located on the perpendicular line extending from the protruding end of the eave portion 27 to the lower side. Also, liquid flowing down from the upper surface of the eave portion 27 flows down along the path indicated by the white arrow shown in FIG. 5. At this time, the liquid passes the outer side of the flange portion 26a, and thus it is possible to suppress ingression of liquid into the electrical connection box 2 through the insertion port 26.

The angle θ is more preferably less than or equal to 40 degrees, and even more preferably less than or equal to 35 degrees. Also, the angle θ is preferably greater than or equal to 30 degrees.

As shown in FIG. 3, the bottom wall of the housing box 22 is provided with a plurality of holes 22a passing through the bottom wall in the thickness direction. Liquid inside the electrical connection box 2 is discharged to the outside through the holes 22a.

The above-described configuration makes it possible to reduce the outer size of the electrical connection box 2, and to suppress ingression of liquid into the electrical connection box 2 through the insertion port 26. Also, even in the case where the electrical connection box 2 is inclined due to the vehicle 100 being inclined, it is possible to suppress ingression of liquid through the insertion port 26.

Also, because the extending portion 23a covers the gap between the lower surface of the lid 23 and the flange portion 22b, it is possible to suppress ingression of liquid into the electrical connection box 2 through the gap. Also, because the eave portion 27 is provided in the lid 23, it is possible to deal with the lid 23 and the eave portion 27 in an integrated manner.

Also, even if the electrical connection box 2 is disposed in the luggage compartment in the case of not being waterproofed using a sealing member as with the electrical distribution box 11, the above-described configuration makes it possible to suppress ingression of liquid into the electrical connection box 2.

Note that the insertion port 26 may be provided in the middle portion of a side wall of the housing box 22 in the vertical direction, and the eave portion 27 may protrude from the side wall, instead of the lid 23. Also, a configuration may be adopted in which no flange portion 26a is provided.

The embodiments that were disclosed here are considered in all respects to be illustrative and not restrictive. The scope of the present disclosure is defined by the appended claims and not by the above description, and all changes that come within the meaning and range of equivalency of the claims are intended to be embraced therein.

What is claimed is:

1. An electrical connection box configured to house an electrical device, to interconnect a plurality of in-vehicle devices via the housed electrical device, and to be provided in a vehicle, the electrical connection box comprising:

an insertion port that passes through a side wall and into which an electric wire to be connected to the electrical device is inserted; and an eave portion that is provided along an upper edge portion of the insertion port and protrudes outwardly by a predetermined length, wherein the predetermined length is based on a maximum stable inclination angle of the vehicle.

2. The electrical connection box according to claim 1, comprising:

an opening provided in an upper portion; and a lid for closing the opening, wherein the eave portion is provided in the lid.

3. The electrical connection box according to claim 2, wherein an angle formed between a straight line connecting a protruding end of the eave portion and a lower edge of the insertion port and a perpendicular line extending from an upper edge of the insertion port to the lower edge of the insertion port is less than or equal to 40 degrees.

4. The electrical connection box according to claim 2, wherein an angle formed between a straight line connecting a protruding end of the eave portion and a lower edge of the insertion port and a perpendicular line extending from an upper edge of the insertion port to the lower edge of the insertion port is less than or equal to 35 degrees.

5. The electrical connection box according to claim 2, wherein an angle formed between a straight line connecting a protruding end of the eave portion and a lower edge of the insertion port and a perpendicular line extending from an upper edge of the insertion port to the lower edge of the insertion port is greater than or equal to 30 degrees.

6. The electrical connection box according to claim 1, wherein an angle formed between a straight line connecting a protruding end of the eave portion and a lower edge of the insertion port and a perpendicular line extending from an upper edge of the insertion port to the lower edge of the insertion port is less than or equal to 40 degrees.

7. The electrical connection box according to claim 1, wherein an angle formed between a straight line connecting a protruding end of the eave portion and a lower edge of the insertion port and a perpendicular line extending from an upper edge of the insertion port to the lower edge of the insertion port is less than or equal to 35 degrees.

8. The electrical connection box according to claim 1, wherein an angle formed between a straight line connecting a protruding end of the eave portion and a lower edge of the insertion port and a perpendicular line extending from an upper edge of the insertion port to the lower edge of the insertion port is greater than or equal to 30 degrees.

* * * * *